(12) United States Patent
Beele

(10) Patent No.: US 6,365,013 B1
(45) Date of Patent: Apr. 2, 2002

(54) COATING METHOD AND DEVICE

(75) Inventor: Wolfram Beele, Ratingen (DE)

(73) Assignee: Siemens Aktiengesellschaft, Allemagne (DE)

(*) Notice: Subject to any disclaimer, the term of this patent is extended or adjusted under 35 U.S.C. 154(b) by 0 days.

(21) Appl. No.: 09/530,632

(22) PCT Filed: Oct. 21, 1998

(86) PCT No.: PCT/DE98/03091

§ 371 Date: Jul. 10, 2000

§ 102(e) Date: Jul. 10, 2000

(87) PCT Pub. No.: WO99/23273

PCT Pub. Date: May 14, 1999

(30) Foreign Application Priority Data

Nov. 3, 1997 (DE) .......................... 197 48 539

(51) Int. Cl.[7] .............................. C23C 14/34; C23C 4/00
(52) U.S. Cl. .................... 204/192.16; 204/298.07; 118/723 R; 118/723 VE; 118/723 DC; 118/715; 118/732; 118/300; 118/306; 118/317; 427/236; 427/237; 427/238; 427/239; 427/421; 427/446; 427/455; 427/456

(58) Field of Search ...................... 204/192.12, 192.16, 204/298.07; 118/723 R, 723 VE, 723 PC, 715, 732, 300, 306, 317; 427/236, 237, 238, 239, 421, 446, 455, 456, 523, 528, 531

(56) References Cited

U.S. PATENT DOCUMENTS

| | | | | |
|---|---|---|---|---|
| 3,247,004 A | * | 4/1966 | Dosser ...................... | 427/104 |
| 3,830,721 A | * | 8/1974 | Gruen et al. ............ | 204/298.07 |
| 4,407,712 A | * | 10/1983 | Henshaw et al. ....... | 204/298.05 |
| 5,110,435 A | * | 5/1992 | Haberland ............. | 204/192.12 |
| 5,456,940 A | * | 10/1995 | Funderburk ............ | 427/421 |
| 5,716,500 A | * | 2/1998 | Bardos et al. .......... | 204/192.12 |

* cited by examiner

Primary Examiner—Rodney G. McDonald
(74) Attorney, Agent, or Firm—Daniel C. Abeles; Eckert Seamans Cherin & Mellott, LLC

(57) ABSTRACT

The invention relates to a coating process, particularly for coating a gas turbine blade (1) having cooling passageways (4) opening out onto the surface (2). During the coating operation, a fluid (6) is directed out of the cooling passageways (4) to prevent blocking of the cooling passageways (4). The invention also relates to an apparatus for implementing this coating process.

23 Claims, 2 Drawing Sheets

COATING METHOD AND DEVICE

FIELD OF THE INVENTION

The invention relates to a coating process to coat a component having a surface and a passageway that opens out into an aperture on the surface. The invention furthermore relates to an apparatus to implement this coating process.

BACKGROUND

EP 0 253 754 A1 describes a coating process. A turbine blade, at the surface of which cooling holes open, is coated. During coating of the surface, closure of these cooling holes is prevented by closing each with a plug prior to coating. Such a plug prevents the coating material from penetrating into the cooling hole.

The object of the invention is to define a coating process that avoids blocking or unacceptable narrowing of a passageway aperture. A further object of the invention is to define an apparatus to implement this coating process.

SUMMARY OF THE INVENTION

According to the invention, the process-related object is attained by a coating process for coating a component, which has a surface and a passageway that opens out at an aperture on the surface, whereby a coating material is applied to the surface and at the same time a fluid is directed through the passageway and out of the aperture, and whereby the fluid is preheated prior to being directed out of the aperture, particularly to a temperature ranging between 100° C. and 900° C., preferably between 400° C. and 700° C.

Such a coating process prevents the passageway from being blocked by coating material during the coating operation or from being undesirably narrowed at the aperture. This is achieved in that the fluid flowing out of the aperture at least partially displaces the coating material. This prevents larger amounts of coating material from getting into the aperture, A suitable adjustment of the pressure at which the fluid flows out of the aperture makes it possible to regulate to what extent the coating material is being displaced by the fluid. It is thus possible to influence the amount of coating material being deposited at the mouth of the passageway, i.e. to influence the coating thickness that forms there. In addition, preheating the fluid prevents the formation of locally cooled areas due to the fluid around the cooling passageway apertures, or cooling of the entire gas turbine blade. A non-preheated fluid, which would cause at least local cooling of the gas turbine blade could thus lead to defects in the layer structure of the coating. For as a rule, a gas turbine blade is kept at a high temperature during the coating operation to improve the quality of the coating.

BRIEF DESCRIPTION OF THE DRAWINGS

The invention will now be described in greater detail, by way of example, with reference to the drawing in which.

Identical reference numbers in the different figures have the same meaning.

DESCRIPTION OF THE PREFERRED EMBODIMENT

Figure 1:
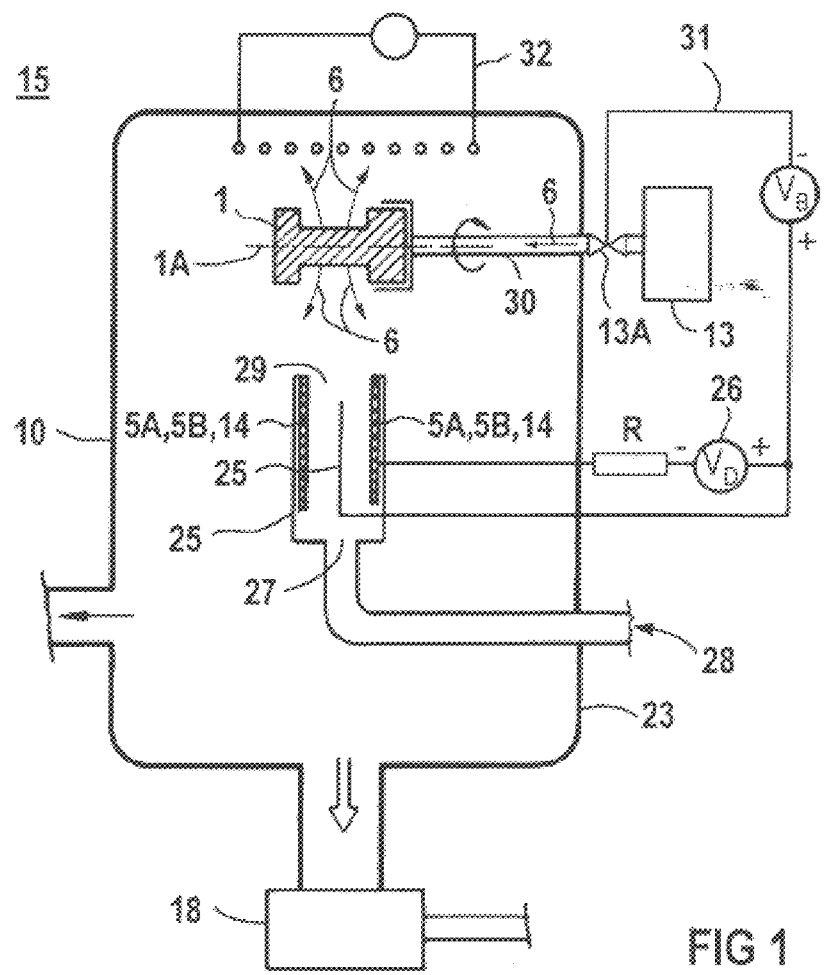
FIG. 1 shows a component arranged in a coating apparatus.

According to the invention, the process-related object is attained by a coating process for coating a component, which has a surface and a passageway that opens out at an aperture on the surface, whereby a coating material is applied to the surface and at the same time a fluid is directed through the passageway and out of the aperture, and whereby the fluid is preheated prior to being directed out of the aperture, particularly to a temperature ranging between 100° C. and 900° C., preferably between 400° C. and 700° C.

Such a coating process prevents the passageway from being blocked by coating material during the coating operation or from being undesirably narrowed at the aperture. This is achieved in that the fluid flowing out of the aperture at least partially displaces the coating material his prevents larger amounts of coating material from getting into the aperture. A suitable adjustment of the pressure at which the fluid flows out of the aperture makes it possible to regulate to what extent the coating material is being displaced by the fluid. It is thus possible to influence the amount of coating material being deposited at the mouth of the passageway, i.e. to influence the coating thickness that forms there. In addition, preheating the fluid prevents the formation of locally cooled areas due to the fluid around the cooling passageway apertures, or cooling of the entire gas turbine blade. A non-preheated fluid, which would cause at least local cooling of the gas turbine blade, could thus lead to defects in the layer structure of the coating. For as a rule, a gas turbine blade is kept at a high temperature during the coating operation to improve the quality of the coating.

Preferably, the aperture has a small cross-sectional area compared to the surface, particularly a cross-sectional area of less than 2% of the surface. Small holes, in particular, can be easily blocked during coating. It is now possible to apply a coating without risk of blocking the passageways even to components that have small passageway apertures on the surface.

The component used is preferably a component of a thermal machine that can be subjected to a hot gas. Another component used is preferably a turbine blade, particularly a gas turbine blade, in which the passageway is a cooling passageway. Gas turbine blades frequently have an interior cooling structure, so that they can be cooled by the introduction of coolant gas. Cooling passageways also open out at the surface that can be subjected to a hot gas. The coolant gas exiting from these cooling passageways flows along the surface of the blade and provides so-called film cooling or, in case of very fine passageways, transpiration cooling of the blade. To be able to counter the highly corrosive and thermal stresses of a gas turbine blade, the blade is additionally often provided with a coating. Both an oxidation or corrosion protective coating and a thermal barrier coating, or a combination of the two in a coating system, may be provided. In addition, an interlayer to bond the thermal barrier coating may also be provided.

Such a coating is typically the component that limits the overhaul interval of a gas turbine blade. Economically, it is often useful to refurbish the coating of such a gas turbine blade from time to time to be able to make full use of the life of the basic component. Refurbishing the coating of a gas turbine blade, in particular, poses the problem of avoiding impairment of the effectiveness of the cooling system during the coating operation due to blockage of the cooling passageways opening onto the surface. By pressing a fluid through the cooling passageways during the coating operation, including, e.g., for each individual layer of an aforementioned coating system blockage or unacceptable narrowing of the cooling passageways can be prevented.

Preferably, a thermal barrier coating, particularly a zirconium oxide-based coating is applied.

Furthermore, an oxidation and/or corrosion protective coating is preferably applied, particularly a MCrAlY coating comprising;

- at least one metal selected from the group comprising iron, cobalt, nickel, abbreviated as M,
- chromium (Cr)
- aluminum (Al), and
- yttrium (Y) and/or hafnium and/or a metal selected from the rare earth group, particularly scandium, lanthanum or cerium.

Preferably, the oxidation and/or corrosion protective coating contains rhenium in addition, particularly at a concentration of 1 wt- % to 15 wt- %.

The coating is preferably applied by means of a PVD (Physic Vapor Deposition) process. The coating is furthermore preferably applied by means of a gas jet sputter process (GS-PVD process), whereby the coating material is detached from a solid compound through ion bombardment by an ion beam, carried to the surface by the ion beam, and deposited on the surface. In a gas jet sputter process, a gas, preferably an inert gas such as argon, is ionized on an anode and accelerated toward a cathode. The coating material in solid form is located on the cathode. Material is detached from this solid by the incident ions and is carried to the component surface by the ionizing argon where it is deposited.

Coating by the gas jet sputter process is preferably carried out within a chamber, whereby a chamber pressure is adjusted in the chamber, and whereby the fluid is directed out of the aperture at a pressure exceeding the chamber pressure by 0.02 to 0.2 mbar. For the gas jet sputter process, the above-indicated overpressure for the outflowing fluid compared to the chamber pressure has proven to be a particularly suitable pressure to control the deposition of coating material in the passageway aperture area.

The coating is preferably applied by a thermal spray process. Furthermore, the coating is preferably applied by plasma spraying particularly by means of vacuum or low-pressure plasma spraying, whereby an ion beam carries the coating material to the surface. With plasma spraying, an electric arc is ignited between a cathode, typically a tungsten cathode, and an anode, typically a water-cooled annular copper anode, which ionizes the inflowing plasma gas and thus produces a plasma. The coating material is injected into this plasma at high velocity via a carrier gas, melted, and carried by the plasma to the surface of the component to be coated where it is deposited. At the point where the beam strikes, referred to as spot, there is a prevailing spot pressure, which depends, e.g., on the velocity of the ion beam.

Preferably, the spot pressure at the point where the plasma beam strikes the surface is 200 to 600 mbar, whereby the fluid is directed out of the aperture at a pressure which is 20% to 120% of the spot pressure, particularly tower than the spot pressure. Furthermore, coating is preferably carried out in a chamber in which a chamber pressure is produced, whereby the fluid is directed out of the opening at a pressure which is 10% to 40%, particularly approximately 20% above the chamber pressure.

The fluid used is preferably an inert gas, particularly argon. The use of an inert gas prevents any chemical influences of the fluid on the coating.

The apparatus-related object according to the invention is attained by an apparatus to implement the coating process on a gas turbine blade with cooling passageways opening out onto its surface, in which an inert gas tank is provided that can be fluidically connected with the gas turbine blade.

FIG. 1 shows schematically and not to scale the principal structure of a coating apparatus 15 to implement a gas jet sputtering process. Coating apparatus 15 has a housing 23 in which a vacuum of less than 1 mbar, particularly approximately 0.5 mbar, can be produced by means of a vacuum pump unit 18. A hollow cathode 24 with circular cylindrical cross section is arranged within housing 23. To coat large components, several such hollow cathodes, or a linear hollow cathode with rectangular cross section oriented along a longitudinal axis may be used. A hollow cathode opening in a trapezoid may also be used. A rod-shaped anode 25 connected with hollow cathode 24 via a DC voltage supply 26 is arranged within hollow cathode 24. DC voltage supply 26 produces a DC voltage of, e.g., 400 V to 800 V. Hollow cathode 24 in a solid compound 14 has a coating material 5A, 5B made as a hollow cylinder or consisting of, e.g., individual plates filling the inside wall of hollow cathode 24. Hollow cathode 24 has an exterior housing with a gas intake opening 27 connected to a gas supply (not depicted), through which an inert gas 28, particularly argon, is introduced into hollow cathode 24. Hollow cathode 24, on the opposite side of gas intake opening 27, has a gas outlet opening 29 through which inert gas 28 flows out of hollow cathode 24. Geodetically above gas outlet opening 29, a component 1, a gas turbine blade, is held in a holding device 30. Holding device 30 can be electrically connected with hollow cathode 24 via an additional voltage supply 31. A DC voltage that can be applied between hollow cathode 24 and holding device 30 or component 1 cleans the surface of component 1 by ionizing inert gas atoms. Holding device 30 is preferably provided with a drive unit (not further depicted) which continuously moves component 1 about its longitudinal axis 1A. A heating unit 32 to heat the component through thermal radiation or convection is arranged geodetically above component 1. Depending on the requirement, heating unit 32 can of course also be arranged next to component 1 on the same geodetic level. Likewise, all configurations indicated can be implemented in reversed geodetic or in horizontal arrangement Gas turbine blade 1 is connected with an inert gas tank, preferably argon, via holding device 30. Argon can be introduced into gas turbine blade 1 through the opening of a valve 13A. Gas turbine blade 1 has cooling passageways 4 (see FIG. 3) which open out onto surface 2 of gas turbine blade 1. Argon flows out of these cooling passageways 4 during the coating operation to prevent blockage or unacceptable narrowing of cooling passageways 4.

Figure 2:
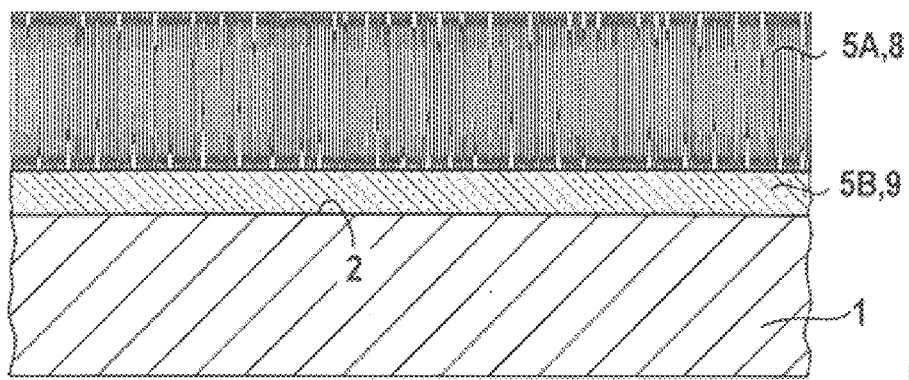
FIG. 2 is a longitudinal section through a coating of a gas turbine blade.

FIG. 2 shows a segment of a longitudinal section through a gas turbine blade 1 with a surface 2. Coating material 5B forming an oxidation and/or corrosion protective coating 9 of MCrAlY is applied to surface 2. Coating material 5A is applied as a ceramic thermal barrier coating 8 to oxidation an/or corrosion protective coating 9.

Figure 3:
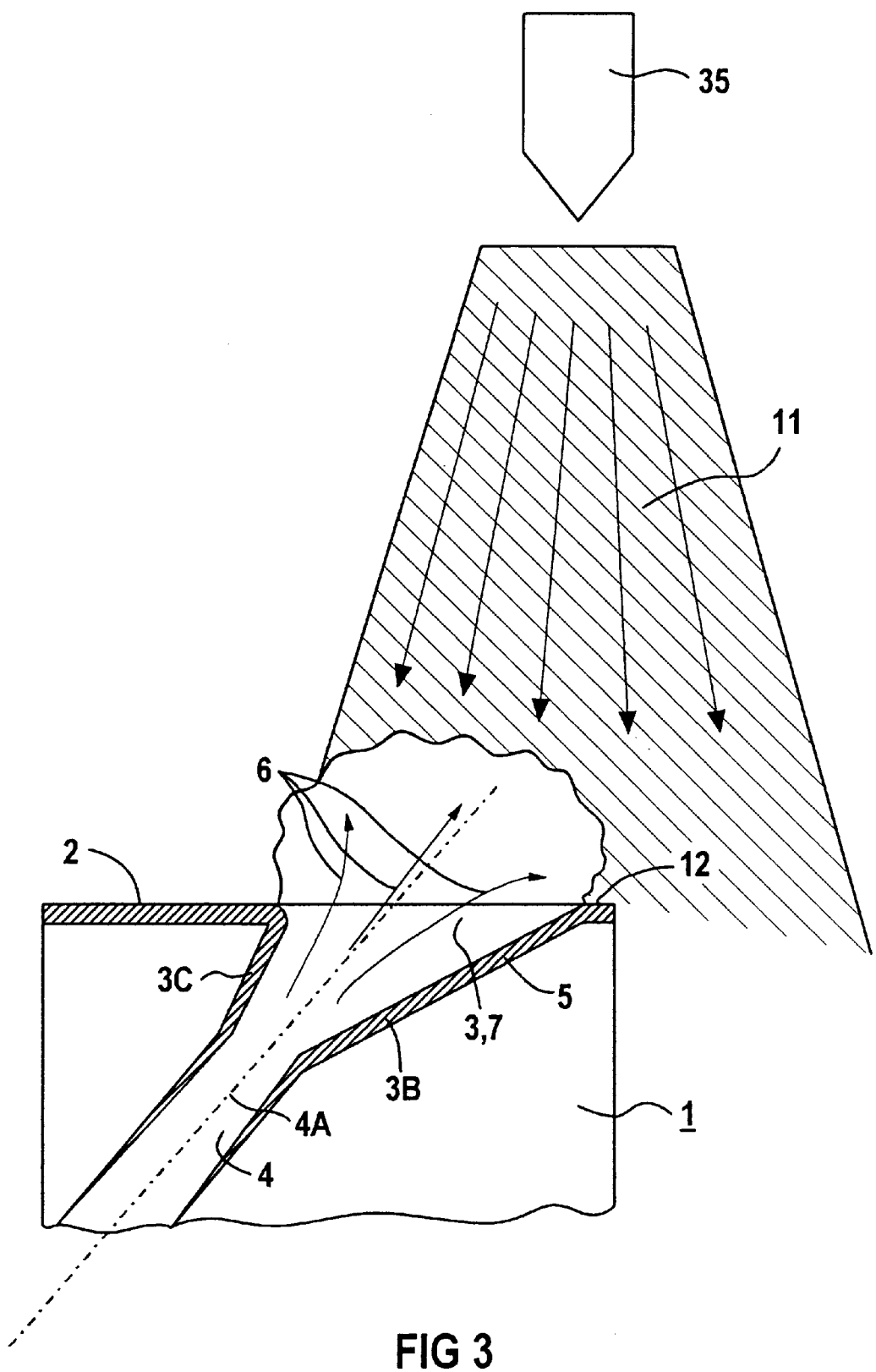
FIG. 3 is a longitudinal section through a cooling passageway at the surface of a gas turbine blade during a coating operation.

FIG. 3 shows a longitudinal section through a cooling passageway 4 that opens out at an aperture 3 onto ice 2 of a gas turbine blade 1. Cooling passageway 4 runs at an angle along an axis 4B to surface 2 and trapezoidally expands in a plane perpendicular to the drawing plane (not shown in this representation). The longitudinal section through aperture 3 results in a first side 3B and, opposite thereto, in a second side 3C of aperture 3. The first side 3B runs at a flat angle to surface 2. This achieves that during operation of such a gas turbine blade 1 in a gas turbine unit (not depicted)

coolant gas exits through cooling passageway 4 to form a film along surface 2. The trapezoidally expanding aperture 3 fans out the coolant gas.

In the exemplary embodiment according to FIG. 3, gas turbine blade 1 is coated by plasma spraying. An ion beam 11 of ionizing argon exits from a plasma spray gun 35, which is depicted only schematically. This ion beam 11 carries along coating material 5. Coating material 5 strikes surface 2 at a point 12, the spot, where it is deposited. At point 12, as a function of, among other things, the velocity of ion beam 11, there is a prevailing spot pressure. Coating material 5 also strikes passageway wall 4A of passageway 4 and is deposited in passageway 4 along passageway wall 4A with decreasing film thickness as the penetration depth increases. To prevent coating material 5 from excessively narrowing or even blocking aperture 3, a fluid 6, in this case argon is directed out of cooling passageway 4. The exiting fluid 6 thus displaces at least a portion of coating material 5 and thereby prevents an undesirably high deposition of coating material 5 in the area of aperture 3. An unacceptable narrowing of aperture 3 is thus avoided. Such a narrowing can reduce the cooling capacity due to the reduced mount of coolant gas that is able to pass through. Furthermore, an unacceptably high deposition of coating material 5 can also cause the exit angle of the coolant gas to be increased, particularly on side 3B of the aperture, reducing the effectiveness of film cooling. By avoiding an unacceptable narrowing of aperture 3, the quality of date cooling system is maintained even after a gas turbine blade 1 has been coated.

What is claimed is:

1. A coating process for coating a component having a surface and a passageway opening out at an aperture onto the surface, wherein a coating material is applied to the surface and at the same time a fluid is directed through the passageway out of the aperture, and wherein the fluid is preheated prior to being directed out of the aperture, to a temperature of between 100° C. and 900° C.

2. The coating process claimed in claim 1, wherein the aperture has a small cross-sectional area compared to the surface, the cross-sectional area comprising less than approximately 2% of the surface.

3. The coating process claimed in claim 1, wherein the component used is a component of a thermal machine that is subjected to a hot gas.

4. The coating process claimed in claim 3, wherein the component used is a gas turbine blade, with the passageway comprising a cooling passageway.

5. The coating process claimed in claim 3, wherein the component used is a heat shield for a combustion chamber lining.

6. The coating process claimed in claim 1, wherein an oxidation or a corrosion protective coating is applied, comprising:

at least one metal selected from the group comprising iron, cobalt, nickel, chromium (Cr)

aluminum (Al), and yttrium (Y) and/or a metal selected from the rare earth group.

7. The coating process of claim 6, wherein the rare earth group comprises scandium, lanthanum or cerium.

8. The coating process claimed in claim 1, wherein a thermal barrier coating is applied.

9. The coating process of claim 8, wherein the thermal barrier coating comprises zirconium oxide.

10. The coating process claimed in claim 1, wherein the coating operation is carried out by means of a PVD (Physical Vapor Deposition) process.

11. The coating process claimed in claim 10, wherein the coating operation is carried out with a gas jet sputter process (GS-PVD coating process), whereby the coating material is detached from a solid compound by ion bombardment and is deposited on the surface.

12. The coating process claimed in claim 11, wherein the coating operation takes place within a chamber, whereby a chamber pressure is adjusted in the chamber and whereby the fluid is directed out of the aperture at a pressure exceeding the chamber pressure by 0.02 to 0.2 mbar.

13. The coating process claimed in claim 1, wherein the coating operation is carried out by means of a thermal spray process.

14. The coating process claimed in claim 13, wherein the thermal spray process used is a plasma spray process comprising a vacuum or low-pressure plasma spray process, whereby an ion beam carries the coating material to the surface.

15. The coating process claimed in claim 14, wherein, at a point where the ion beam strikes the surface, a spot pressure prevails, comprising a spot pressure of 200 to 600 mbar, whereby the fluid is directed out at a pressure which is 20% to 120% of the spot pressure.

16. The coating process of claim 15 wherein the fluid is directed out at a pressure which is lower than the spot pressure.

17. The coating process claimed in claim 14 taking place in a chamber in which a chamber pressure is produced, whereby the fluid is directed out of the aperture at a pressure which is 10% to 40% above the chamber pressure.

18. The coating process of claim 17 wherein the fluid is directed out of the aperture at a pressure which approximately 20% above the chamber pressure.

19. The coating process claimed in claim 1, wherein an inert gas is used as the fluid.

20. The coating process of claim 19 wherein the inert gas is argon.

21. A coating apparatus to implement a coating process on a gas turbine blade having a passageway in gaseous communication with the interior of the turbine blade and opening out onto an exterior surface of the turbine blade comprising:

means for coating the exterior surface of the blade; and an inert gas tank fluidly connectable to an interior portion of the gas turbine blade in fluid communication with the passageway opening.

22. A coating process for coating a component having a surface and a passageway communicating with one side of the surface and opening out at an aperture on the other side of the surface, wherein a coating material is applied to the other side of the surface and at the same time a fluid is directed from the one side of the surface through the passageway out of the aperture on the opposite side of the surface being coated.

23. The coating process claimed in claim 22 wherein the fluid is preheated prior to being directed out of the aperture.

* * * * *